(12) United States Patent
Kang et al.

(10) Patent No.: US 12,133,321 B2
(45) Date of Patent: Oct. 29, 2024

(54) ELECTRONIC DEVICE

(71) Applicant: Huawei Digital Power Technologies Co., Ltd., Shenzhen (CN)

(72) Inventors: Junpeng Kang, Shenzhen (CN); Zhuyong Huang, Dongguan (CN); Bo Xiao, Dongguan (CN); Wenhai Yao, Dongguan (CN)

(73) Assignee: HUAWEI DIGITAL POWER TECHNOLOGIES CO., LTD., Shenzhen (CN)

( * ) Notice: Subject to any disclaimer, the term of this patent is extended or adjusted under 35 U.S.C. 154(b) by 190 days.

(21) Appl. No.: 17/988,222

(22) Filed: Nov. 16, 2022

(65) Prior Publication Data

US 2023/0073713 A1 Mar. 9, 2023

(51) Int. Cl.
| G06F 1/16 | (2006.01) |
| H05K 1/02 | (2006.01) |
| H05K 5/00 | (2006.01) |
| H05K 7/20 | (2006.01) |

(52) U.S. Cl.
CPC ......... *H05K 1/0203* (2013.01); *H05K 7/2039* (2013.01)

(58) Field of Classification Search
CPC .. H05K 1/0203; H05K 1/0204; H05K 1/0206; H05K 1/0207; H05K 1/0209; H05K 1/021; H05K 1/0201; H05K 7/2039; H05K 7/20436; H05K 7/20409; H05K 7/20418; H05K 7/20427; H05K 7/20445; H05K 7/20454; H05K 7/20463; H05K 7/20472; H05K 7/205; H05K 7/20509
See application file for complete search history.

(56) References Cited

U.S. PATENT DOCUMENTS

| 5,648,889 | A  | * | 7/1997 | Bosli | H01L 23/4006 |
| | | | | | 257/E23.084 |
| 7,746,653 | B2 | * | 6/2010 | Negrut | H01L 23/4006 |
| | | | | | 165/185 |
| 7,796,391 | B2 | * | 9/2010 | Fischer | H02S 40/34 |
| | | | | | 165/80.3 |
| 9,076,752 | B2 | * | 7/2015 | Kojima | H01L 23/4093 |
| 11,063,495 | B2 | * | 7/2021 | Skinner | H05K 7/20145 |

(Continued)

FOREIGN PATENT DOCUMENTS

WO 2008097271 A2 8/2008

*Primary Examiner* — Anthony M Haughton
(74) *Attorney, Agent, or Firm* — Conley Rose, P.C.

(57) ABSTRACT

An electronic device includes a heat dissipation part, a plurality of electronic components, and a fixed potential part. The electronic component is fastened to the heat dissipation part, and an insulation pad is disposed between the electronic component and the heat dissipation part. The fixed potential part has a fixed potential, and the heat dissipation part is electrically connected to the fixed potential part. The heat dissipation part has the fixed potential, a potential difference between the electronic component and the heat dissipation part is reduced, and a requirement of a safety specification between the electronic component and the heat dissipation part is reduced. The electronic component can be relatively close to the heat dissipation part, and a surrounding energized component of the heat dissipation part can also be closer to the heat dissipation part.

20 Claims, 3 Drawing Sheets

(56) References Cited

U.S. PATENT DOCUMENTS

| | | | |
|---|---|---|---|
| 11,664,573 B2* | 5/2023 | Greenstein | H05K 7/20509 |
| | | | 361/728 |
| 11,849,536 B1* | 12/2023 | Ingalz | H05K 7/1428 |
| 11,889,662 B1* | 1/2024 | Yang | H05K 7/20509 |
| 11,997,812 B2* | 5/2024 | Fine | H05K 5/061 |
| 2005/0264998 A1* | 12/2005 | McCutcheon | H01L 23/4006 |
| | | | 257/E23.084 |
| 2010/0280802 A1 | 11/2010 | Calmels | |
| 2019/0312342 A1* | 10/2019 | Sautter | H01Q 1/3275 |

\* cited by examiner

ELECTRONIC DEVICE

CROSS-REFERENCE TO RELATED APPLICATION

This claims priority to Chinese Patent Application No. 202111352508.4 filed on Nov. 16, 2021, which is hereby incorporated by reference in its entirety.

TECHNICAL FIELD

This disclosure relates to the field of electronic product technologies, and in particular, to an electronic device.

BACKGROUND

In a high power or high temperature scenario, an electronic component inside an electronic device needs to be connected to a heat sink to perform auxiliary heat dissipation. The heat sink usually uses a metal material with a good heat-conducting property. The heat sink of the metal material is prone to accumulate electric charges and is prone to form a high voltage difference with a surrounding electronic component, and consequently discharge ignition is caused, resulting in a fault, for example, a failure of the electronic component. Therefore, it needs to be ensured that there is a relatively large safety specification between the electronic component and the heat sink. Currently, for an electronic component, especially for an electronic component connected to a heat sink, a requirement of a safety specification between the electronic component and the heat sink is usually met by increasing a physical distance between the electronic component and the heat sink. However, in this manner of ensuring the safety specification between the electronic component and the heat sink, space utilization is reduced, and a power density of an electronic device is limited. Consequently, it is difficult to improve the power density of the electronic device.

SUMMARY

This disclosure provides an electronic device, so that the electronic device can have a relatively high power density.

The electronic device provided in this disclosure may include a heat dissipation part, a plurality of electronic components, and a fixed potential part. The electronic component may be fastened to the heat dissipation part, and an insulation pad may be disposed between the electronic component and the heat dissipation part. The fixed potential part has a fixed potential, and the heat dissipation part can be electrically connected to the fixed potential part to have the fixed potential.

In the technical solution provided in this disclosure, the heat dissipation part may be electrically connected to the fixed potential part, so that the heat dissipation part can have the fixed potential. Therefore, a potential difference between the electronic component and the heat dissipation part is reduced, and a requirement of a safety specification between the electronic component and the heat dissipation part is reduced. In this way, the requirement of the safety specification between the electronic component and the heat dissipation part is easy to meet, the electronic component can be relatively close to the heat dissipation part, and the electronic component and the heat dissipation part can be relatively compactly arranged, so that space utilization is relatively high, thereby facilitating improvement of a power density of the electronic device. Furthermore, the heat dissipation part is electrically connected to the fixed potential part, so that the heat dissipation part can be prevented from accumulating electric charges, thereby avoiding the following case: The heat dissipation part forms a high voltage difference with a surrounding energized component, and consequently discharge ignition is caused, resulting in a fault, for example, a failure of the component. Therefore, the surrounding energized component of the heat dissipation part can be closer to the heat dissipation part, thereby also helping improve the power density of the electronic device. The electronic device provided in this disclosure may be applied to a scenario at a low voltage level, and may also be applied to scenarios at medium and high voltage levels; and have relatively low production costs, relatively good EMI performance, and relatively high reliability.

In a specific implementable solution, the electronic device may further include a circuit board, and the electronic component and the fixed potential part are disposed on the circuit board. The fixed potential part may be a pin or another element with a fixed potential on the circuit board. In this way, when the heat dissipation part is electrically connected to the fixed potential part, the heat dissipation part can have the fixed potential.

When the heat dissipation part is connected to the fixed potential part, the heat dissipation part may be connected to the fixed potential part by using an electric-conductor. This facilitates connection between the heat dissipation part and the fixed potential part.

In a specific implementable solution, the heat dissipation part may have a first positioning hole, a conductive fastener may be disposed in the first positioning hole, and the electric-conductor may be connected to the conductive fastener, to implement connection between the electric-conductor and the heat dissipation part. This facilitates connection between the electric-conductor and the heat dissipation part, thereby facilitating connection between the fixed potential part and the heat dissipation part.

In a specific implementable solution, the electronic component may have a second positioning hole, a first positioning member may be disposed in the second positioning hole, and the electronic component may be connected to the heat dissipation part by using the first positioning member. Further, the first positioning member may be penetrated through the second positioning hole to connect the electronic component to the heat dissipation part. This facilitates fastening between the electronic component and the heat dissipation part.

In a specific implementable solution, the heat dissipation part may have a third positioning hole, and the first positioning member may be inserted into the third positioning hole. The third positioning hole is disposed, so that a safety specification between the heat dissipation part and the electronic component can be increased, and a requirement of the safety specification between the heat dissipation part and the electronic component can be reduced. Therefore, a physical distance between the heat dissipation part and the electronic component may be shorter, so that the power density of the electronic device can be improved. In addition, fastening between the electronic component and the heat dissipation part is implemented by fitting the first positioning member with the third positioning hole, so that stability of connection between the electronic component and the heat dissipation part can be enhanced, thereby avoiding the following case: The electronic component is separated from the heat dissipation part in an extreme case such as vibration, resulting in a non-ideal heat dissipation effect.

In a specific implementable solution, an insulation sleeve may be disposed in the second positioning hole, and the first positioning member may be penetrated through the insulation sleeve, to be connected to the heat dissipation part. Because the insulation sleeve is disposed, electrical isolation may be implemented between the first positioning member and the electronic component, so that electrical isolation can be implemented between the electronic component and the heat dissipation part. In addition, the insulation sleeve is disposed, so that a safety specification between the electronic component and the heat dissipation part can be increased, thereby further reducing a requirement of the safety specification between the electronic component and the heat dissipation part. Therefore, a physical distance between the electronic component and the heat dissipation part may be shorter, so that the power density of the electronic device can be further improved. Furthermore, the heat dissipation part has the fixed potential because of being electrically connected to the fixed potential part, so that a potential difference between the electronic component and the heat dissipation part is reduced, and a requirement of a safety specification from the electronic component to the heat dissipation part is also reduced. In this way, a size of the insulation sleeve may be made small, so that costs can be reduced. In addition, an aperture of the second positioning hole in the electronic component may be made small, so that impact of hole opening in the electronic component on performance of the electronic component can be reduced.

In a specific implementable solution, an insulation ring may be sleeved onto the first positioning member, and the insulation ring may be located on a side that is of the electronic component and that is away from the heat dissipation part. Further, the insulation ring may be located between an end that is of the first positioning member and that is away from the heat dissipation part and the electronic component. The insulation ring is disposed, so that a head of the first positioning member is not in direct contact with the electronic component, thereby ensuring electrical isolation between the first positioning member and the electronic component.

In a specific implementable solution, the insulation pad may be bonded to the heat dissipation part, and the electronic component may also be bonded to the insulation pad, that is, two sides of the insulation pad may be respectively bonded to the heat dissipation part and the electronic component. This facilitates connection between the electronic component and the heat dissipation part.

When the insulation pad is disposed, an area of the insulation pad may be greater than an area of a connection surface between the electronic component and the heat dissipation part. In this way, the entire connection surface on which the electronic component and the heat dissipation part are interconnected can be in contact with the insulation pad, and the entire connection surface on which the electronic component and the heat dissipation part are interconnected can be electrically isolated by the insulation pad, thereby improving stability of electrical isolation between the electronic component and the heat dissipation part.

In a specific implementable solution, there may be at least one heat dissipation part and at least one fixed potential part, each heat dissipation part may be electrically connected to the fixed potential part with a different fixed potential, and each heat dissipation part may be connected to at least one electronic component. Further, one heat dissipation part may be connected to one or more electronic components. In this way, when potential differences between a plurality of electronic components are relatively large, the plurality of electronic components may be divided into a plurality of groups, electronic components of each group are connected to one heat dissipation part, and potentials of the electronic components of each group are close to each other, thereby helping reduce potential differences between the electronic components of each group and the heat dissipation part. Therefore, requirements of safety specifications from the electronic components of each group to the heat dissipation part can be reduced, so that the power density of the electronic device can be improved. In addition, each heat dissipation part is connected to a proper fixed potential part, so that a potential difference between heat dissipation parts can be reduced. Therefore, the heat dissipation parts can be relatively close to each other, thereby also improving the power density of the electronic device. In addition, the heat dissipation parts can be relatively close to each other, so that electronic components of different groups can be relatively close to each other, thereby also improving the power density of the electronic device.

REFERENCE SIGNS

1—Heat dissipation part; 2—Electronic component; 3—Fixed potential part; 4—Insulation pad; 5—Circuit board; 6—Electric-conductor; 7—Conductive fastener; 8—First positioning member; 9—Insulation sleeve; and 10—Insulation ring.

DESCRIPTION OF EMBODIMENTS

The following describes in detail embodiments of this disclosure with reference to accompanying drawings.

For ease of understanding, an application scenario of an electric device in this disclosure is first described. The electronic device provided in the embodiments of this disclosure may be applied to a plurality of fields, for example, may be used as a power supply unit to convert a given voltage into a required voltage or current of a user end by using power electronic topologies in different forms. The electronic device may include a plurality of electronic components inside. Based on a specific use scenario and requirement, the electronic component may be an insulated gate bipolar transistor (IGBT), a metal-oxide-semiconductor field-effect (MOSFET or MOS) transistor, a diode, a bipolar junction transistor (BJT) (also usually referred to as a dual carrier transistor), a negative temperature coefficient (NTC) sensor, or the like.

In some specific use scenarios, for example, in a high power or high temperature scenario, an electronic component inside an electronic device may be connected to a heat sink to perform auxiliary heat dissipation. The heat sink usually uses a metal material with a good heat-conducting property. When a heat sink is connected to a plurality of electronic components, and potentials of the plurality of electronic components are different, a safety specification between electronic components with different potentials needs to be considered. A requirement of a safety specification is relatively high especially when a potential difference between different electronic components is relatively large. For electronic components connected to a heat sink, a requirement of a safety specification between the electronic components is usually met by increasing a physical distance between the electronic components in the conventional technology. However, in this manner, a power density of an electronic device is limited, resulting in a relatively large obstacle for improvement of the power density of the electronic device.

Based on this, the embodiments of this disclosure provide an electronic device, to improve a power density of the electronic device.

Figure 1:
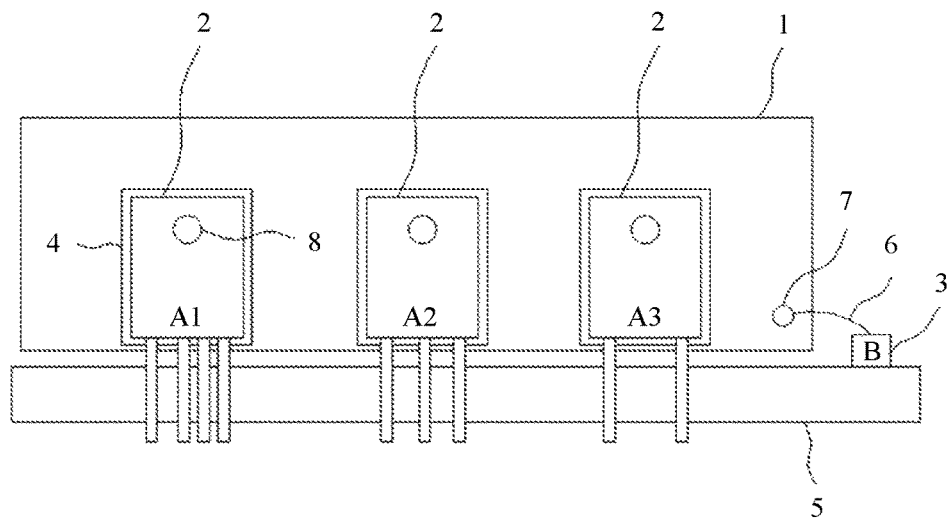
FIG. 1 is a schematic diagram of a structure of an electronic device according to an embodiment of this disclosure.

First, refer to FIG. 1. FIG. 1 is a schematic diagram of a structure of an electronic device according to an embodiment of this disclosure. As shown in FIG. 1, the electronic device provided in this embodiment of this disclosure may include a heat dissipation part 1, an electronic component 2, and a fixed potential part 3. The heat dissipation part 1 may use a sheet-like structure. A material of the heat dissipation part 1 may be a conductive material with a relatively ideal heat-conducting property, such as copper, aluminum, or an alloy, and there may be a plurality of heat dissipation parts 1. There may be a plurality of electronic components 2. FIG. 1 shows a case in which there are three electronic components 2. The electronic component 2 may be fastened to the heat dissipation part 1. A surface that is of the electronic component 2 and that is connected to the heat dissipation part 1 may be a plane, and correspondingly, a surface that is of the heat dissipation part 1 and that is connected to the electronic component 2 may also be a plane. An insulation pad 4 is disposed between the electronic component 2 and the heat dissipation part 1, so that the electronic component 2 is not in direct contact with the heat dissipation part 1, to form electrical isolation between the electronic component 2 and the heat dissipation part 1. The heat dissipation part 1 may be electrically connected to the fixed potential part 3, so that the heat dissipation part 1 can have a fixed potential. Therefore, a potential difference between the electronic component 2 and the heat dissipation part 1 is reduced. In this way, a requirement of a safety specification (safety specification, mainly referred to as an electrical clearance and a creepage distance) between the electronic component 2 and the heat dissipation part 1 can be reduced, so that the electronic component 2 can be relatively close to the heat dissipation part 1, thereby facilitating improvement of a power density of the electronic device. Improvement of the power density is relatively easy to implement, so that research and development investments can be reduced. In addition, because the electronic component 2 can be relatively close to the heat dissipation part 1, the insulation pad 4 may be relatively thin, thereby reducing costs. Furthermore, the heat dissipation part 1 is electrically connected to the fixed potential part 3, so that the heat dissipation part 1 can be prevented from accumulating electric charges, thereby avoiding the following case: The heat dissipation part 1 forms a high voltage difference with a surrounding energized component, and consequently discharge ignition is caused, resulting in a fault, for example, a failure of the component. Therefore, the surrounding energized component of the heat dissipation part 1 can be closer to the heat dissipation part 1, thereby also helping improve the power density of the electronic device. In addition, impact on electromagnetic interference (EMI) or the like of the electronic device can be avoided, thereby improving reliability of the electronic device.

As a possible embodiment, the electronic device may further include a circuit board 5, and the electronic component 2 may be electrically connected to the circuit board 5. Therefore, power supply, signal transmission, and the like of each electronic component 2 can be implemented by using the circuit board 5. Based on a use scenario and an actual requirement, another electronic component, an integrated element, or the like that is not mentioned above may be further disposed on the circuit board 5. This is not limited in this embodiment of this disclosure. During specific implementation, the circuit board 5 may be a printed circuit board (PCB). The fixed potential part 3 may be disposed on the circuit board 5. For example, the fixed potential part 3 may be a pin or another element with a fixed potential on the circuit board 5. Therefore, when the heat dissipation part 1 is electrically connected to the fixed potential part 3, the heat dissipation part 1 can have the fixed potential. It may be understood that the fixed potential is a relative concept. In actual use, a potential of the fixed potential part 3 may fluctuate to a specific degree, and a potential value may be represented as a range. However, this does not affect an effect that a potential difference between the electronic component 2 and the heat dissipation part 1 can be reduced after the heat dissipation part 1 is connected to the fixed potential part 3.

During specific implementation, the heat dissipation part 1 may be electrically connected to the fixed potential part 3 by using an electric-conductor 6. For example, the electric-conductor 6 may be a conducting wire, that is, the heat dissipation part 1 may be electrically connected to the circuit board 5 by using the conducting wire. During actual implementation, a first positioning hole may be disposed in the heat dissipation part 1, and a conductive fastener 7 may be disposed in the first positioning hole, so that the conductive fastener 7 can be electrically connected to the heat dissipation part 1 on a fastening basis. From an angle of view shown in FIG. 1, the first positioning hole is shielded by the conductive fastener 7. Therefore, the first positioning hole is not shown in the figure. A first end of the electric-conductor 6 may be electrically connected to the fixed potential part 3, and a second end of the electric-conductor 6 may be electrically connected to the heat dissipation part 1, to implement electrical connection between the heat dissipation part 1 and the fixed potential part 3. The conductive fastener 7 can be used to fasten the electric-conductor 6, thereby facilitating connection between the electric-conductor 6 and the heat dissipation part 1, and can also conduct electricity. For example, the conductive fastener 7 may be a metal screw. When the conductive fastener 7 is a metal screw, correspondingly, the first positioning hole is a tapped hole, and the conductive fastener 7 may be rotatably connected to the first positioning hole, to implement fastening between the conductive fastener 7 and the heat dissipation part 1. When the electric-conductor 6 is a conducting wire, the electric-conductor 6 may be wound around the conductive fastener 7, to implement fastening and electrical connection between the electric-conductor 6 and the conductive fastener 7.

It may be understood that the electric-conductor 6 may be alternatively another element with a conductive property. For example, the electric-conductor 6 may be a metal sheet. In this case, the second end of the electric-conductor 6 may have a through hole. The conductive fastener 7 may be penetrated through the through hole and connected to the first positioning hole, and the conductive fastener 7 presses the second end of the electric-conductor 6 against the heat dissipation part 1, to implement fastening and electrical connection between the electric-conductor 6 and the heat dissipation part 1.

In addition to the foregoing connection manner, the heat dissipation part 1 may be alternatively connected to the fixed potential part 3 in another manner. For example, a pin may be disposed on the heat dissipation part 1, and the pin may be directly soldered to the fixed potential part 3, to implement electrical connection between the heat dissipation part 1 and the fixed potential part 3.

As a possible embodiment, a second positioning hole may be disposed in the electronic component 2, a first positioning member 8 may be disposed in the second positioning hole, and the electronic component 2 may be fastened to the heat dissipation part 1 by using the first positioning member 8, that is, the first positioning member 8 is penetrated through the second positioning hole to fasten the electronic component 2 to the heat dissipation part 1. Correspondingly, a third positioning hole may be disposed in the heat dissipation part 1, and the first positioning member 8 is inserted into the third positioning hole. From the angle of view shown in FIG. 1, the second positioning hole is shielded by the first positioning member 8, and the third positioning hole is shielded by the electronic component 2. Therefore, neither the second positioning hole nor the third positioning hole is shown in the figure. The third positioning hole is disposed, so that an electrical clearance and a creepage distance between the heat dissipation part 1 and the electronic component 2 can be increased, thereby increasing a safety specification between the heat dissipation part 1 and the electronic component 2, and reducing a requirement of the safety specification between the heat dissipation part 1 and the electronic component 2. Therefore, a physical distance between the heat dissipation part 1 and the electronic component 2 may be shorter, so that the power density of the electronic device can be improved. During specific implementation, the first positioning member 8 may be a screw. In this case, the third positioning hole may be a tapped hole, and the first positioning member 8 is threadably connected to the third positioning hole, to implement fastening between the first positioning member 8 and the heat dissipation part 1, thereby implementing fastening between the electronic component 2 and the heat dissipation part 1. Fastening between the electronic component 2 and the heat dissipation part 1 is implemented by fitting the first positioning member 8 with the third positioning hole, so that stability of connection between the electronic component 2 and the heat dissipation part 1 can be enhanced, thereby avoiding the following case: The electronic component 2 is separated from the heat dissipation part 1 in an extreme case such as vibration, resulting in a non-ideal heat dissipation effect, component damage due to collision, or the like.

Figure 2:
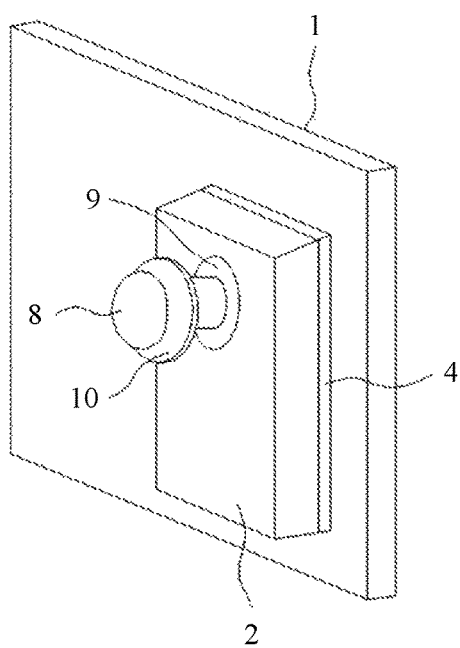
FIG. 2 is a schematic diagram of a connection status between an electronic component and a heat dissipation part of an electronic device according to an embodiment of this disclosure.

Refer to FIG. 2 together. FIG. 2 is a schematic diagram of a connection status between an electronic component and a heat dissipation part of an electronic device according to an embodiment of this disclosure. To more clearly show the connection status, the first positioning member 8 is in a state of being not fully assembled in place in FIG. 2. With reference to FIG. 1 and FIG. 2, to ensure electrical isolation between the electronic component 2 and the heat dissipation part 1, an insulation sleeve 9 may be disposed in the second positioning hole, a middle part of the insulation sleeve 9 has a through hole, and an outer wall of the insulation sleeve 9 may abut against a hole wall of the second positioning hole, so that a position of the insulation sleeve 9 in the second positioning hole may be kept stable. The first positioning member 8 is penetrated through the insulation sleeve 9 through the through hole of the insulation sleeve 9, and is fastened to the heat dissipation part 1. Because the insulation sleeve 9 is disposed, electrical isolation may be implemented between the first positioning member 8 and the electronic component 2, so that electrical isolation can be implemented between the electronic component 2 and the heat dissipation part 1. In addition, the insulation sleeve 9 is disposed, so that an electrical clearance and a creepage distance between the electronic component 2 and the heat dissipation part 1 can be increased, thereby increasing a safety specification between the electronic component 2 and the heat dissipation part 1, and further reducing a requirement of the safety specification between the electronic component 2 and the heat dissipation part 1. Therefore, a physical distance between the electronic component 2 and the heat dissipation part 1 may be shorter, so that the power density of the electronic device can be further improved. It may be understood that the heat dissipation part 1 has the fixed potential because of being electrically connected to the fixed potential part 3, so that a potential difference between the electronic component 2 and the heat dissipation part 1 is reduced, and a requirement of a safety specification between the electronic component 2 and the heat dissipation part 1 is also reduced. A size of the insulation sleeve 9 may be relatively small, so that costs can be reduced. An aperture of the second positioning hole in the electronic component 2 may be relatively small, so that impact of hole opening on the electronic component 2 can be reduced. During specific implementation, the first positioning member 8 may abut against an inner wall of the insulation sleeve 9, that is, the first positioning member 8 may abut against a hole wall of the through hole in the insulation sleeve 9. Because the insulation sleeve 9 has electrically isolated the first positioning member 8 from the electronic component 2, this embodiment of this disclosure imposes no limitation on whether the first positioning member 8 is conductive. For example, when the first positioning member 8 is a screw, the first positioning member 8 may be a screw made of a non-conductive material, for example, a plastic screw, or may be a conductive metal screw.

As a possible embodiment, an insulation ring 10 may be sleeved onto the first positioning member 8, and a radial size of the insulation ring 10 may be greater than the aperture of the second positioning hole. When the first positioning member 8 fastens the electronic component 2 to the heat dissipation part 1, the insulation ring 10 may be located on a side that is of the electronic component 2 and that is away from the heat dissipation part 1. Further, the insulation ring 10 may be located between an end that is of the first positioning member 8 and that is away from the heat dissipation part 1 and the electronic component 2, so that the end that is of the first positioning member 8 and that is away from the heat dissipation part 1 is not in direct contact with the electronic component 2, thereby ensuring that electrical isolation can be implemented between the first positioning member 8 and the electronic component 2 when the first positioning member 8 uses a conductive material. For example, the first positioning member 8 fastens the electronic component 2 to the heat dissipation part 1; and when the first positioning member 8 is a screw, the insulation ring 10 is located between a head of the screw and the electronic component 2.

In some possible embodiments, when the electronic component 2 is fastened to the heat dissipation part 1 by using the first positioning member 8, the insulation pad 4 may be a ceramic sheet or a plastic insulation sheet, so that the electronic component 2 is not in direct contact with the heat dissipation part 1, and the electronic component 2 is electrically isolated from the heat dissipation part 1.

In some other possible embodiments, the electronic component 2 may be bonded to the insulation pad 4 to implement fastening, and the insulation pad 4 may also be bonded to the heat dissipation part 1 to implement fastening. For example, two sides of the insulation pad 4 may be respectively bonded to the heat dissipation part 1 and the electronic component 2, to implement fastening between the electronic component 2 and the heat dissipation part 1. During actual implementation, bonding between the electronic component 2 and the insulation pad 4 may be implemented by using an adhesive layer. Further, the adhesive layer may be made of thermally conductive silicone. Similarly, bonding between the insulation pad 4 and the heat dissipation part 1 may also be implemented by using an adhesive layer. The adhesive layer may also be made of thermally conductive silicone. Alternatively, the insulation pad 4 may have adhesiveness, and therefore can implement fastening between the electronic component 2 and the heat dissipation part 1. It should be noted that, in this case, the insulation pad 4 further has a heat-conducting property. It may be understood that when the electronic component 2 is fastened to the insulation pad 4 in an adhesive manner, and the insulation pad 4 is also fastened to the heat dissipation part 1 in an adhesive manner, the electronic component 2 may be further fastened to the heat dissipation part 1 by using the first positioning member 8, to enhance stability of fastening between the electronic component 2 and the heat dissipation part 1.

During specific implementation, to ensure stability of electrical isolation between the electronic component 2 and the heat dissipation part 1, an area of the insulation pad 4 may be greater than an area of a connection surface between the electronic component 2 and the heat dissipation part 1, so that the entire connection surface on which the electronic component 2 and the heat dissipation part 1 are interconnected can be in contact with the insulation pad 4, and the entire connection surface on which the electronic component 2 and the heat dissipation part 1 are interconnected can be electrically isolated by the insulation pad 4.

The following describes a connection status between the electronic component 2 and the heat dissipation part 1 with reference to a potential of the electronic component 2.

For ease of description, for example, there are three electronic components 2. As shown in FIG. 1, potentials of the three electronic components 2 are respectively defined as A1, A2, and A3.

When potential differences between the plurality of electronic components 2 are relatively small, such as when A1≈A2≈A3, the heat dissipation part 1 may choose to be electrically connected to a fixed potential part 3 whose potential is B on the circuit board 5, and the potential B meets B≈A1≈A2≈A3, so that a potential difference between any electronic component 2 and the heat dissipation part 1 is reduced, and a requirement of a safety specification from any electronic component 2 to the heat dissipation part 1 is reduced. Therefore, the electronic component 2 can be relatively close to the heat dissipation part 1, so that the power density of the electronic device can be improved.

When potential differences between the plurality of electronic components 2 are relatively large, such as when A1>A2≈A3, the heat dissipation part 1 may choose to be electrically connected to a fixed potential part 3 whose potential is B on the circuit board 5, and the potential B meets A1>B>A2≈A3, so that a potential difference between an electronic component 2 whose potential is A1 and the heat dissipation part 1 is reduced, and potential differences between electronic components 2 whose potentials are A2 and A3 and the heat dissipation part 1 are also reduced, in other words, a potential difference between each electronic component 2 and the heat dissipation part 1 is reduced; and a requirement of a safety specification from each electronic component 2 to the heat dissipation part 1 is reduced. Therefore, the electronic component 2 can be relatively close to the heat dissipation part 1, so that the power density of the electronic device can also be improved.

When potential differences between the plurality of electronic components 2 are relatively large, such as when A1>A2>A3, the heat dissipation part 1 may choose to be electrically connected to a fixed potential part 3 whose potential is B on the circuit board 5, and the potential B meets A1>B≈A2>A3, so that a potential difference between an electronic component 2 whose potential is A2 and the heat dissipation part 1 is reduced, and potential differences between electronic components 2 whose potentials are A1 and A3 and the heat dissipation part 1 are also reduced, in other words, a potential difference between each electronic component 2 and the heat dissipation part 1 is reduced; and a requirement of a safety specification from each electronic component 2 to the heat dissipation part 1 is reduced. Therefore, the electronic component 2 can be relatively close to the heat dissipation part 1, so that the power density of the electronic device can also be improved.

During actual application, a plurality of electronic components 2 may be connected to a plurality of heat dissipation parts 1 based on potential statuses of the electronic components 2. This is further described as follows.

Likewise, for ease of description, for example, there are three electronic components 2, and potentials of the three electronic components 2 are respectively defined as A1, A2, and A3.

Figure 3:
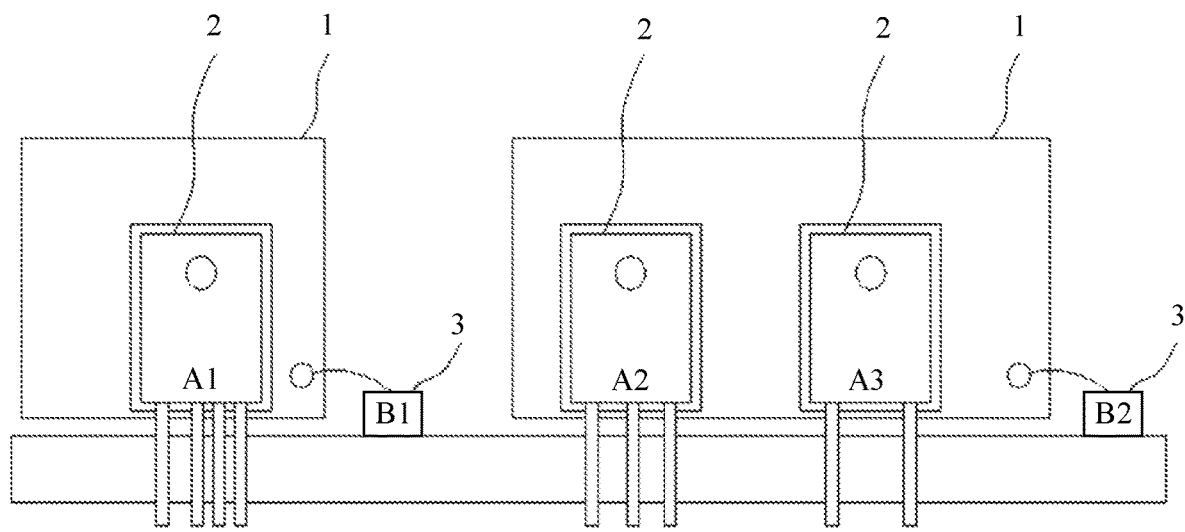
FIG. 3 is a schematic diagram of a structure of an electronic device according to another embodiment of this disclosure.

When potential statuses of the three electronic components 2 are A1>A2≈A3, that is, in the three electronic components 2, potentials of two electronic components 2 are close to each other, and potential differences between the other electronic component 2 and the two electronic components 2 are relatively large, the three electronic components 2 may be divided into two groups, one group includes an electronic component 2 whose potential is A1, and the other group includes electronic components 2 whose potentials are A2 and A3. As shown in FIG. 3, the electronic component 2 whose potential is A1 may be connected to a heat dissipation part 1, the heat dissipation part 1 is electrically connected to a fixed potential part 3 whose potential is B1 on the circuit board, and the potential B1 meets B1≈A1, so that a potential difference between the electronic component 2 whose potential is A1 and the heat dissipation part 1 is reduced, and a requirement of a safety specification from the electronic component 2 to the heat dissipation part 1 is reduced. The electronic components 2 whose potentials are A2 and A3 may be connected to another heat dissipation part 1, the heat dissipation part 1 is electrically connected to a fixed potential part 3 whose potential is B2 on the circuit board, and the potential B2 meets B2≈A2≈A3, so that potential differences between the electronic components 2 whose potentials are A2 and A3 and the heat dissipation part 1 are reduced, and requirements of safety specifications from the electronic components 2 to the heat dissipation part 1 are reduced.

Figure 4:
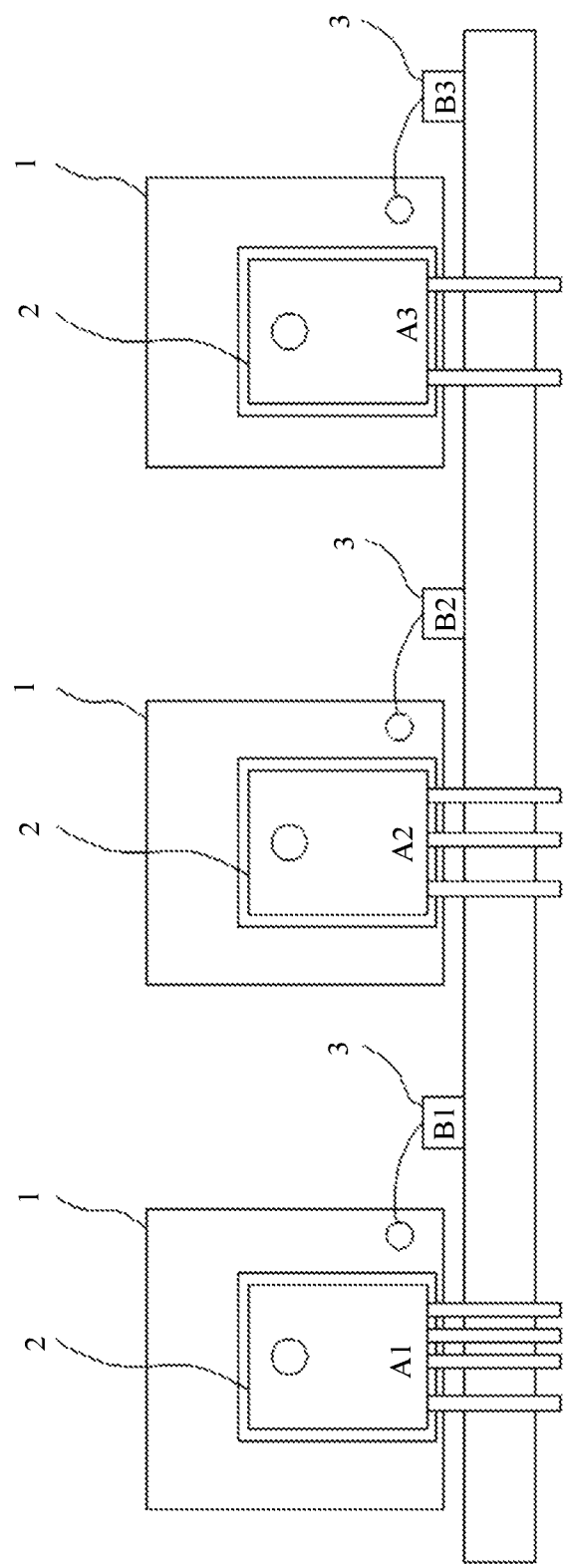
FIG. 4 is a schematic diagram of a structure of an electronic device according to another embodiment of this disclosure.

When potential statues of the three electronic components 2 are A1>A2>A3, that is, potential differences between the three electronic components 2 are all relatively large, the three electronic components 2 may be divided into three groups, and each electronic component 2 constitutes one group. As shown in FIG. 4, an electronic component 2 whose potential is A1 may be connected to a heat dissipation part 1, the heat dissipation part 1 is electrically connected to a fixed potential part 3 whose potential is B1 on the circuit board, and the potential B1 meets B1≈A1, so that a potential difference between the electronic component 2 whose potential is A1 and the heat dissipation part 1 is reduced, and a requirement of a safety specification from the electronic component 2 to the heat dissipation part 1 is reduced. An electronic component 2 whose potential is A2 may be connected to another heat dissipation part 1, the heat dissipation part 1 is electrically connected to a fixed potential part 3 whose potential is B2 on the circuit board, and the potential B2 meets B2≈A2, so that a potential difference between the electronic component 2 whose potential is A2 and the heat dissipation part 1 is reduced, and a requirement of a safety specification from the electronic component 2 to the heat dissipation part 1 is reduced. An electronic component 2 whose potential is A3 may be connected to still another heat dissipation part 1, the heat dissipation part 1 is electrically connected to a fixed potential part 3 whose potential is B3 on the circuit board, and the potential B3 meets B1≈A3, so that a potential difference between the electronic component 2 whose potential is A3 and the heat dissipation part 1 is reduced, and a requirement of a safety specification from the electronic component 2 to the heat dissipation part 1 is reduced.

When a plurality of electronic components 2 are connected to a plurality of heat dissipation parts 1, because each heat dissipation part 1 is connected to a fixed potential part 3, different heat dissipation parts 1 may be connected, in a one-to-one correspondence, to different fixed potential parts 3 with relatively close potentials, that is, the potentials B1, B2, and B3 of the fixed potential parts 3 may be relatively close, to reduce potential differences between the heat dissipation parts 1, and reduce requirements of safety specifications between the heat dissipation parts 1, so that the heat dissipation parts 1 can be relatively close to each other, thereby helping further improve the power density of the electronic device. In addition, the heat dissipation parts 1 can be relatively close to each other, so that electronic components 2 of different groups can also be relatively close to each other, thereby also helping further improve the power density of the electronic devices. In addition, when one heat dissipation part 1 is connected to a plurality of electronic components 2, the plurality of electronic components 2 may be distributed on a same side of the heat dissipation part 1, or may be distributed on different sides of the heat dissipation part 1.

It should be noted that when one heat dissipation part 1 is connected to a plurality of electronic components 2, the plurality of electronic components 2 may be of a same type, or may be of different types. A1, A2, and A3 represent only the potentials of the electronic components 2, instead of limiting types of the electronic components 2, that is, the electronic components 2 whose potentials are A1, A2, and A3 may be of a same type, may be partially of a same type, or may be different from each other.

The foregoing descriptions are merely example specific implementations of this disclosure, but are not intended to limit the protection scope of this disclosure. Any variation or replacement readily figured out by a person skilled in the art within the technical scope disclosed in this disclosure shall fall within the protection scope of this disclosure.

What is claimed:

1. An electronic device, comprising:
   a heat dissipation part;
   a plurality of electronic components, wherein each of the plurality of electronic components is fastened to the heat dissipation part;
   a plurality of insulation pads, wherein an insulation pad of the plurality of insulation pads is disposed between an electronic component of the plurality of electronic components and the heat dissipation part; and
   a fixed potential part having a fixed potential and electrically connected to the heat dissipation part.

2. The electronic device according to claim 1, further comprising a circuit board, wherein the plurality of electronic components and the fixed potential part are disposed on the circuit board.

3. The electronic device according to claim 1, wherein the heat dissipation part has a first positioning hole, wherein a conductive fastener is disposed in the first positioning hole, and wherein the conductive fastener is coupled to an electric-conductor for connecting the heat dissipation part to the fixed potential part.

4. The electronic device according to claim 2, wherein the heat the heat dissipation part has a first positioning hole, wherein a conductive fastener is disposed in the first positioning hole, and wherein the conductive fastener is coupled to an the electric-conductor for connecting the heat dissipation part to the fixed potential part.

5. The electronic device according to claim 1, wherein the electronic component has a second positioning hole, wherein a first positioning member is disposed in the second positioning hole, and wherein the electronic component is connected to the heat dissipation part using the first positioning member.

6. The electronic device according to claim 2, wherein the electronic component has a second positioning hole, wherein a first positioning member is disposed in the second positioning hole, and wherein the electronic component is connected to the heat dissipation part using the first positioning member.

7. The electronic device according to claim 3, wherein the electronic component has a second positioning hole, wherein a first positioning member is disposed in the second positioning hole, and wherein the electronic component is connected to the heat dissipation part by usingusing the first positioning member.

8. The electronic device according to claim 5, wherein the heat dissipation part has a third positioning hole, and wherein the first positioning member is inserted into the third positioning hole.

9. The electronic device according to claim 5, further comprising an insulation sleeve disposed in the second positioning hole, wherein the first positioning member is penetrated through the insulation sleeve and connected to the heat dissipation part.

10. The electronic device according to claim 8, further comprising an insulation sleeve disposed in the second positioning hole, wherein the first positioning member is penetrated through the insulation sleeve and connected to the heat dissipation part.

11. The electronic device according to claim 5, further comprising an insulation ring sleeved onto the first positioning member, wherein the insulation ring is located between an end of the first positioning member and away from the heat dissipation part and the electronic component.

12. The electronic device according to claim 8, further comprising an insulation ring sleeved onto the first positioning member, wherein the insulation ring is located between an end that is of the first positioning member and that is away from the heat dissipation part and the electronic component.

13. The electronic device according to claim 9, further comprising an insulation ring sleeved onto the first positioning member, wherein the insulation ring is located between an end that is of the first positioning member and that is away from the heat dissipation part and the electronic component.

14. The electronic device according to of claim 1, wherein the insulation pad comprises two sides bonded to the heat dissipation part and the electronic component, respectively.

15. The electronic device according to of claim 1, wherein an area of the insulation pad is greater than an area of a connection surface between the electronic component and the heat dissipation part.

16. The electronic device according to of claim 1, further comprising:

a second heat dissipation part; and a second fixed potential part having a second fixed potential and electrically connected to the second heat dissipation part, wherein the second fixed potential is different than the fixed potential of the fixed potential part.

17. The electronic device according to claim 2, wherein the fixed potential part is a pin coupled to the circuit board.

18. The electronic device according to 1, wherein a first electronic component of the plurality of electronic components is fastened to a first side of the heat dissipation part, and wherein a second electronic component of the plurality of electronic components is fastened to a second side of the heat dissipation part opposite the first side.

19. The electronic device according to 18, wherein the first electronic component and the second electronic component are the same type.

20. The electronic device according to 18, wherein the first electronic component and the second electronic component are different types.

* * * * *

UNITED STATES PATENT AND TRADEMARK OFFICE
CERTIFICATE OF CORRECTION

PATENT NO. : 12,133,321 B2
APPLICATION NO. : 17/988222
DATED : October 29, 2024
INVENTOR(S) : Junpeng Kang et al.

Page 1 of 1

It is certified that error appears in the above-identified patent and that said Letters Patent is hereby corrected as shown below:

On the Title Page

Missing (30) Foreign Application Priority Data: should read "Nov. 16, 2021 (CN) … 202111352508.4"

In the Claims

Claim 4, Column 12, Line 26: "heat the heat dissipation part" should read "heat dissipation part"

Claim 7, Column 12, Line 47: "part by usingusing the first" should read "part using the first"

Signed and Sealed this
Twenty-sixth Day of November, 2024

Katherine Kelly Vidal
*Director of the United States Patent and Trademark Office*